US012562706B2

(12) United States Patent
Cheng et al.

(10) Patent No.: US 12,562,706 B2
(45) Date of Patent: Feb. 24, 2026

(54) ISOLATION BETWEEN FILTERS USING INDUCTIVE COUPLING CANCELLATION

(71) Applicant: Apple Inc., Cupertino, CA (US)

(72) Inventors: Haitao Cheng, San Jose, CA (US);
Karim M. Megawer, San Diego, CA
(US)

(73) Assignee: Apple Inc., Cupertino, CA (US)

( * ) Notice: Subject to any disclaimer, the term of this
patent is extended or adjusted under 35
U.S.C. 154(b) by 122 days.

(21) Appl. No.: 18/474,808

(22) Filed: Sep. 26, 2023

(65) Prior Publication Data

US 2025/0105814 A1      Mar. 27, 2025

(51) Int. Cl.
H03H 7/01 (2006.01)

(52) U.S. Cl.
CPC ........ H03H 7/1708 (2013.01); H03H 7/0115
(2013.01); H03H 7/0161 (2013.01); H03H
7/1775 (2013.01)

(58) Field of Classification Search
CPC .......... H03H 7/00; H03H 7/01; H03H 7/0115;
H03H 7/013; H03H 7/0138; H03H
7/0153; H03H 7/0161; H03H 7/09; H03H
7/12; H03H 7/17; H03H 7/1708; H03H
7/1775
USPC ................................. 333/165, 166, 167, 170
See application file for complete search history.

(56) References Cited

U.S. PATENT DOCUMENTS

| | | | |
|---|---|---|---|
| 6,856,192 B2 | 2/2005 | Muramatsu | |
| 7,548,137 B2 | 6/2009 | Wang et al. | |
| 11,206,006 B2 | 12/2021 | Bagga | |
| 11,881,715 B2 * | 1/2024 | Wang .................... | H01F 27/027 |
| 2003/0067349 A1 | 4/2003 | Muramatsu | |
| 2014/0009240 A1 | 1/2014 | Nagai et al. | |
| 2015/0004907 A1 | 1/2015 | Subramoniam et al. | |

FOREIGN PATENT DOCUMENTS

| | | |
|---|---|---|
| JP | 2006-101103 A | 4/2006 |
| KR | 10-2022-0090045 A | 6/2022 |

OTHER PUBLICATIONS

International Search Report and Written Opinion in PCT Appl. No.
PCT/US2024/047467 mailed Dec. 26, 2024, 9 pages.

* cited by examiner

*Primary Examiner* — Hai L Nguyen

(74) *Attorney, Agent, or Firm* — Kowert, Hood, Munyon,
Rankin & Goetzel, P.C.; Dean M. Munyon

(57)            ABSTRACT

Techniques for isolation between filters using inductive
coupling cancellation are disclosed. An apparatus includes a
first filter including a first plurality of inductors and a second
filter including a second plurality of inductors. The first and
second filters are implemented physically adjacent to one
another. First and second ones of the first plurality of
inductors and a first one of the second plurality of inductors
are polarized in a first direction, while a second one of the
second plurality of inductors is polarized in a second direc-
tion opposite that of the first direction. The second one of the
second plurality of inductors is physically adjacent to one of
the first and second ones of the first plurality of inductors
such that magnetic coupling currents induced into one
another are canceled.

20 Claims, 10 Drawing Sheets

*Fig. 3*

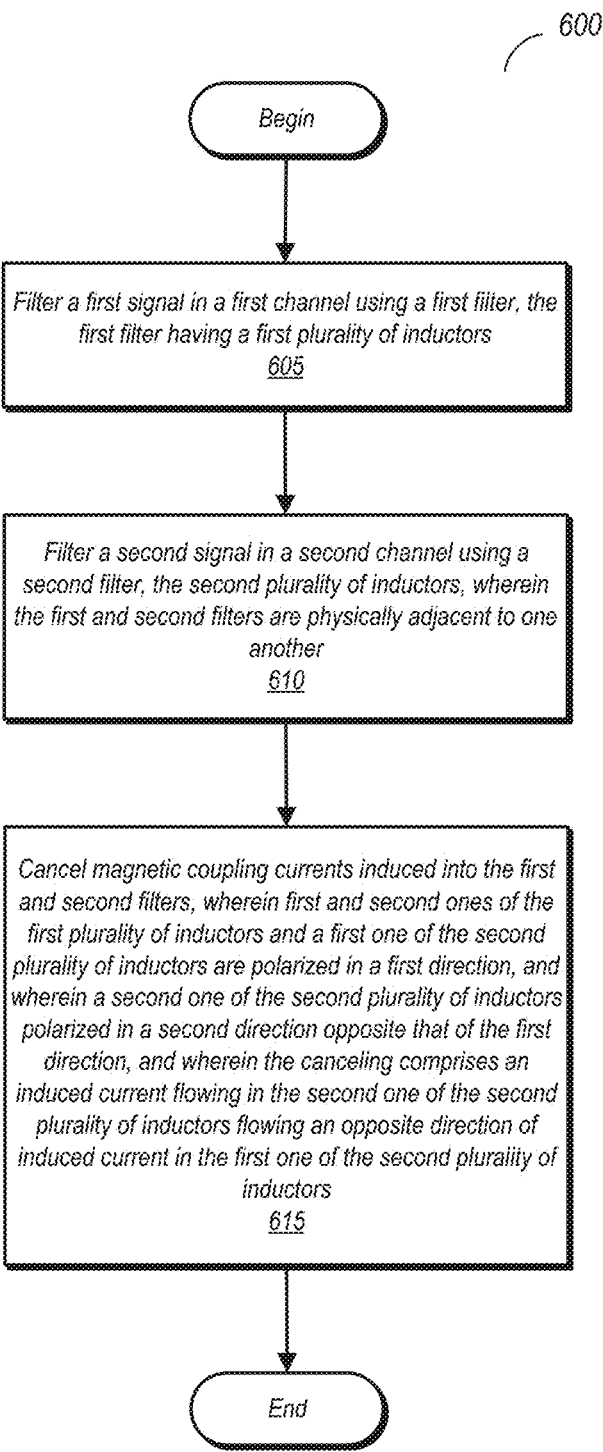

*600*

Begin

Filter a first signal in a first channel using a first filter, the first filter having a first plurality of inductors
605

Filter a second signal in a second channel using a second filter, the second plurality of inductors, wherein the first and second filters are physically adjacent to one another
610

Cancel magnetic coupling currents induced into the first and second filters, wherein first and second ones of the first plurality of inductors and a first one of the second plurality of inductors are polarized in a first direction, and wherein a second one of the second plurality of inductors polarized in a second direction opposite that of the first direction, and wherein the canceling comprises an induced current flowing in the second one of the second plurality of inductors flowing an opposite direction of induced current in the first one of the second plurality of inductors
615

End

*Fig. 6*

ISOLATION BETWEEN FILTERS USING INDUCTIVE COUPLING CANCELLATION

BACKGROUND

Technical Field

This disclosure is directed to electronic circuits, and more particularly passive electronic filters.

Description of the Related Art

Passive filters that utilize inductors and capacitors are widely used in electronic circuits to modify the frequency response of signals. These filters, often known as LC filters, can be more complex than simple first-order designs. By combining multiple inductors and capacitors, higher-order filter configurations can be created, allowing for greater control over the filter's characteristics. Higher-order LC filters offer improved performance in terms of sharper roll-off rates and steeper attenuation outside the desired frequency range. They can be designed to target specific frequency bands, such as low-pass, high-pass, band-pass, or band-stop filters, depending on the arrangement of the inductors and capacitors.

Overall, passive LC filters of varying orders provide flexibility and customization options for modifying signal characteristics, enabling engineers to tailor frequency responses to suit specific application requirements.

SUMMARY

Techniques for isolation between filters using inductive coupling cancellation are disclosed. In one embodiment, an apparatus includes a first filter including a first plurality of inductors and a second filter including a second plurality of inductors. The first and second filters are implemented physically adjacent to one another. First and second ones of the first plurality of inductors and a first one of the second plurality of inductors are polarized in a first direction, while a second one of the second plurality of inductors is polarized in a second direction opposite that of the first direction. The second one of the second plurality of inductors is physically adjacent to one of the first and second ones of the first plurality of inductors such that magnetic coupling currents induced into one another are canceled.

In various embodiments, multiple filters using inductors may be implemented next to one another in physically adjacent channels. In alternating ones of the filters, one of the inductors may be polarized in a direction opposite that of its counterpart inductors in physically adjacent filters of other channels. This may allow for cancellation of currents induced by magnetic coupling, leading to better performance of the filters and less noise in the filtered signals. The filters may be of any type that utilizes inductors, including low pass, high pass, bandpass, and band stop.

BRIEF DESCRIPTION OF THE DRAWINGS

The following detailed description makes reference to the accompanying drawings, which are now briefly described.

FIG. 3 is a schematic diagram illustrating an alternating arrangement of a plurality of filters configured for coupling current cancellation.

FIG. 6 is a flow diagram of one embodiment of a method for operating a plurality of filters according to the disclosure.

DETAILED DESCRIPTION OF EMBODIMENTS

Many passive filters use inductors. When two filters having inductors are in close proximity to one another, inductive coupling can occur. Inductive coupling can have negative effects, such as mutual interference that affects filter characteristics, resonance shifting, (altering their resonant frequencies), and undesired attenuation or amplification at certain frequencies. Mitigation of coupling effects is typically carried out by increasing the physical distance between filters, or through the use of shielding/isolation techniques.

The present disclosure makes use of the insight that when inductors in proximity to one another have the same polarity, the currents that result from magnetic coupling can enhance each other. If the polarity could be changed, the currents from magnetic coupling would cancel each other.

Accordingly, the present disclosure is directed to an arrangement of a number of adjacent filters. The filters are arrange in a manner such that at least one inductor of a particular filter has an opposite polarity of another, adjacent filter. When the adjacent filters are implemented on an integrated circuit, an inductor can be made to have an opposite polarity of another inductor in an adjacent filter by alternating the direction of the windings relative to one another. For example, one inductor may be wound clockwise on the IC, while the corresponding inductor of an adjacent filter may be wound counter-clockwise. When two inductors of physically adjacent filters are arranged in this manner, cancellation of coupling currents induced by magnetic fields may occur. Thus, using the techniques of this disclosure, coupling current may be canceled, and the need for, e.g., shielding between the filters may be obviated.

Various embodiments of filter circuits arranged in accordance with the above are now discussed in further detail below. The discussion begins with a schematic of a basic, two-filter embodiment with inductors arranged to cancel coupling currents, followed by an example of a physical inductor implementation that may be carried out on an integrated circuit (IC) or printed circuit board (PCB). An example of an alternating arrangement of filters (with more than two) follows. Thereafter, the discussion continues with a focus on different filter types (e.g., low pass, high pass) and different orders (e.g., second order, fourth order) which may be implemented using the arrangement disclosed herein. Examples of receivers (both wired and wireless) that utilize the filter arrangement of the present disclosure are then described. A method for operating filters of the present disclosure is then discussed, followed by descriptions of an example device and an example system in which the arrangement may be implemented, followed by one for a computer readable medium that stores instructions usable to manufacture such devices and systems.

Filter Arrangement for Coupling Current Cancellation

Figure 1:
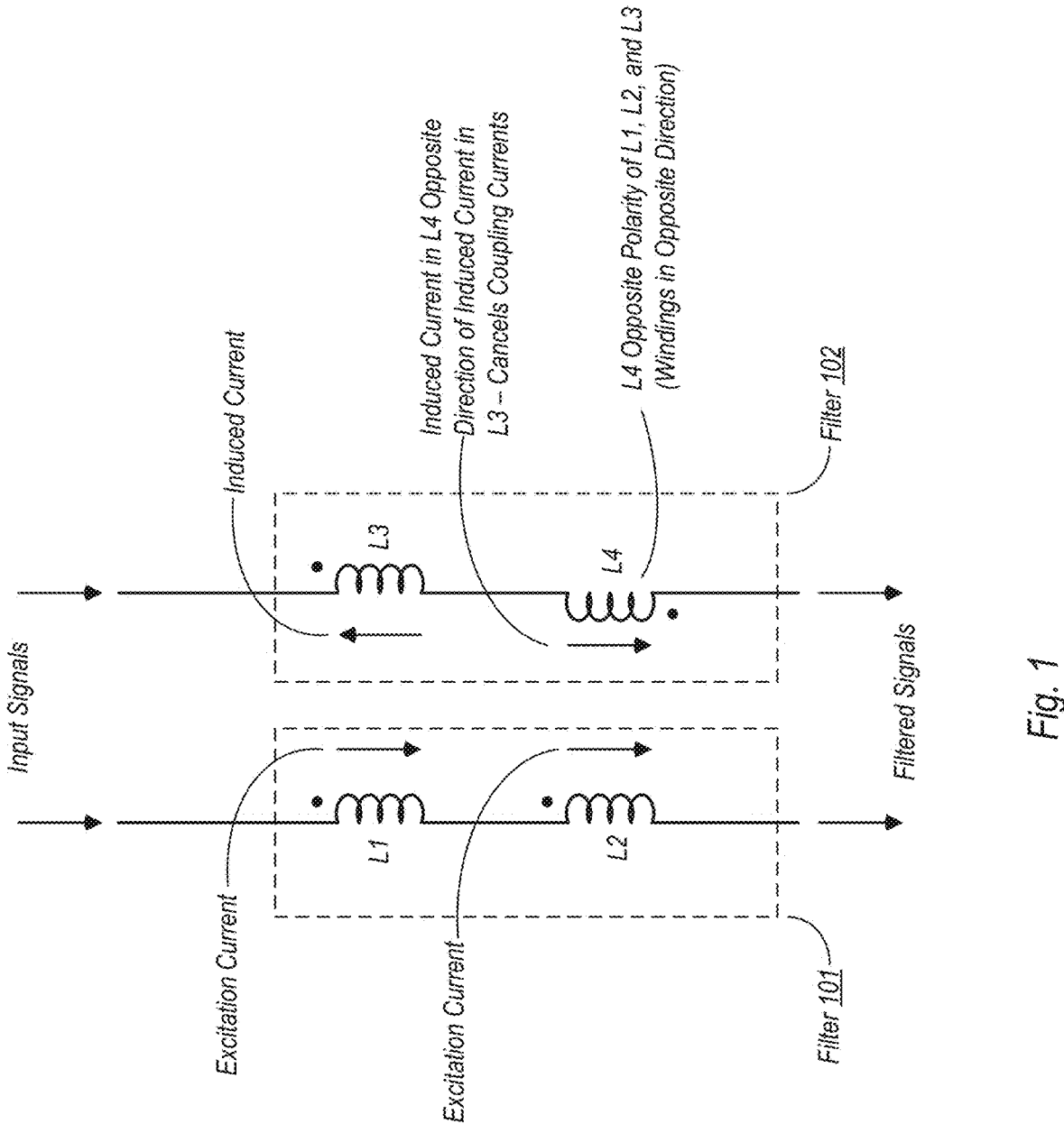
FIG. 1 is a schematic diagram illustrating an apparatus having two channels with physically adjacent filters arranged such that magnetic coupling currents are canceled.

FIG. 1 is a schematic diagram illustrating an apparatus having two channels with physically adjacent filters arranged such that magnetic coupling currents are canceled. In the embodiment shown, filter 101 is arranged in a manner that is adjacent to filter 102. In practice, these two filters are arranged in a manner in which they are actually physically adjacent to one another such that electromagnetic fields induced into the inductors interact with one another. It is also noted that while inductors are the only components shown here, other components (such as resistors and/or capacitors) may also be present. It is further noted that while the discussion in the disclosure is directed to passive components, the components shown here may be implemented in filters that also include active components, such as transistors. Generally speaking, the filters discussed herein may be entirely passive filters or filters that include a combination of passive and active components.

Filter 101 in the embodiment shown includes inductors L1 and L2, while filter 102 includes inductors L3 and L4. In their physical arrangement, L1 of filter 101 may be adjacent to and closest to L3 of filter 102, while L2 of filter 101 may be adjacent to and closest to inductor L4 of filter 102. As shown in FIG. 1, excitation currents passing through inductors L1 and L2 may result in induced currents in inductors L3 and L4. The reverse may also be true, as excitation currents (from a source external to that shown in FIG. 1) flowing through inductors L3 and L4 inducing currents into inductors L1 and L2.

Filters 101 and 102 may be part of a multi-channel communications system through which signals are passed concurrently with one another. In some embodiments, the filters may be configured to filter out different frequency bands. During such operation, the induced currents in one filter, generated by excitation currents in the other, may cause undesirable operation and reduce the effectiveness of both. However, as shown in FIG. 1, inductor L4 is implemented in a manner such that it is polarized in an opposite direction with respect to adjacent inductor L2. Due to this arrangement, the excitation currents passing through L2 cause induced currents in L4 to flow the opposite direction of those in L3. As a result, the induced coupling currents in both L3 and L4 substantially (if not completely) cancel one another. This operation also occurs in the other direction, i.e., excitation current passing through L3 and L4 cause (due to the opposite polarities of L2 and L4) induced coupling currents through L1 and L2 to flow in opposite directions from one another, thereby resulting in cancellation.

The arrangement shown in FIG. 1 may be repeated for any number of filters. For a larger number of filters, the arrangement may be such that alternating instances of the filters have an inductor that is polarized in an opposite direction of any physically adjacent inductors of a different filter. As a result, coupling currents may be cancelled from each of the filters in the arrangement, leading to overall better performance of the systems in which the filter arrangement is implemented.

Physical Inductor Arrangement for Coupling Current Cancellation

Figure 2:
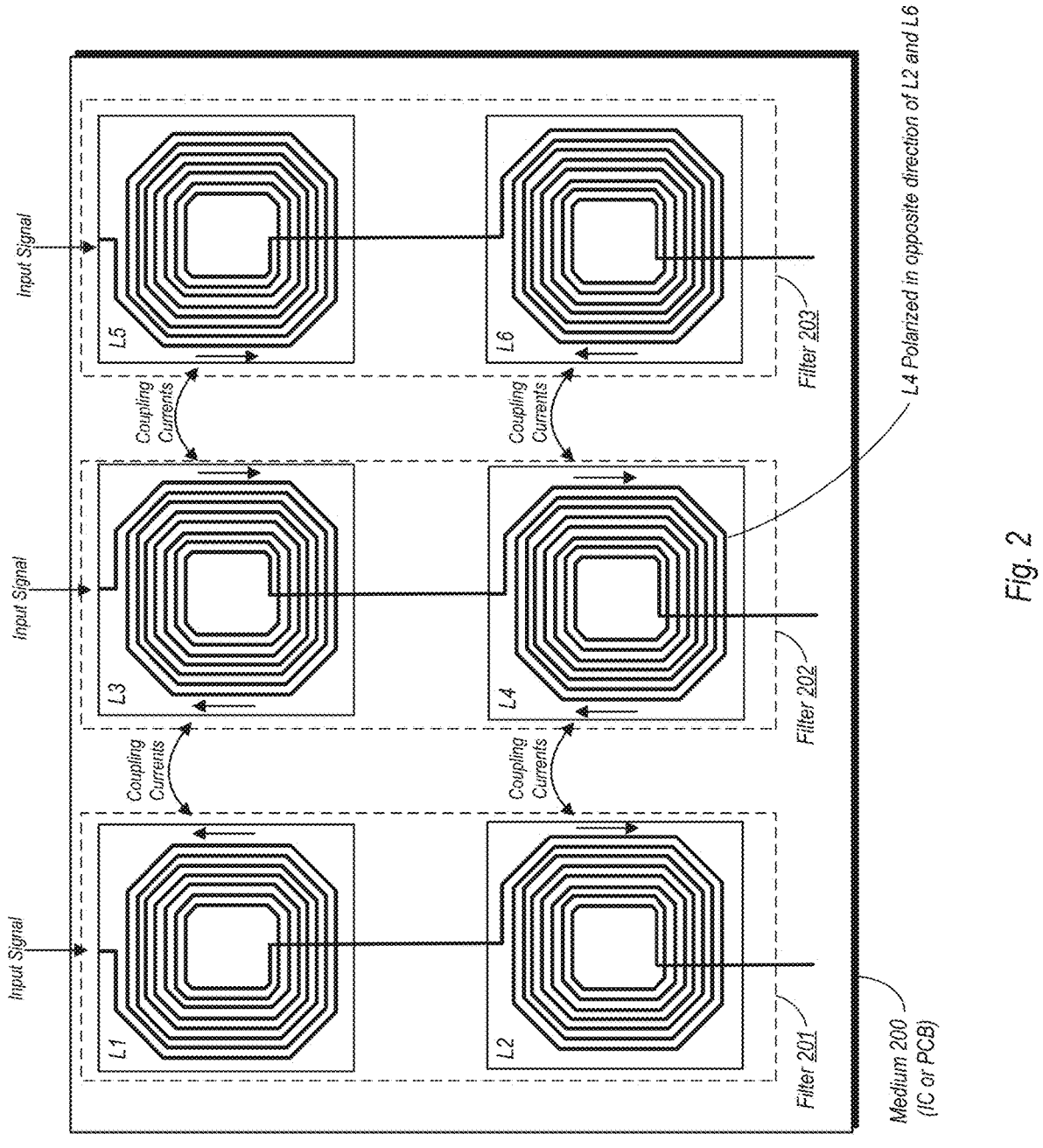
FIG. 2 is a diagram illustrating the implementation of inductors on an integrated circuit (IC) die or on a printed circuit board (PCB) arranged for cancellation of coupling currents.

FIG. 2 is a diagram illustrating the implementation of inductors on an integrated circuit (IC) die or on a printed circuit board (PCB) arranged for cancellation of coupling currents. In the embodiment shown, portions of filters 201, 202, and 203 are shown in an arrangement in which they are adjacent to one another. Although only the inductors of these filters are shown, it is to be understood that other components such as resistors and capacitors may also be included as part of each filter. It is also to be understood that, while the disclosure illustrates filters that are substantially identical to one another, the techniques for canceling coupling currents may be applied to filters that are not identical to one another but are otherwise arranged physically adjacent to one another. Furthermore, the technique may be applied to other circuits utilizing inductors that are arranged in close physical proximity to one another.

In the embodiment shown, filters 201, 202, and 203 are implemented on medium 200. In one embodiment, medium 200 may be an integrated circuit die, while in another embodiment, medium 200 may be a printed circuit board. More generally, medium 200 may be any suitable medium upon which inductors may be implemented, including those discussed here, as well as a substrate of some sort. The present disclosure also contemplates inductors implemented as discrete components but having windings in a particular direction, with the techniques of polarization discussed herein achieved by mounting the discrete inductors in alternating orientations to achieve the effect.

Filter 201 in the embodiment shown includes inductors L1 and L2, filter 202 includes inductors L3 and L4, while filter 203 includes inductors L5 and L6. Inductor L4 of filter 202 is physically adjacent to inductor L2 of filter 201 and inductor L6 of filter 203. Inductors L1, L3, and L5 have the same polarity.

In contrast to the same-direction polarization of inductors L1, L3, and L5, inductor L4 of filter 202 is polarized in a direction opposite that of inductors L2 and L6. Accordingly, inductor L4 is polarized in a direction opposite that of inductors L2 and L6. Because of this arrangement, coupling currents induced into filter 202 by the inductors of filters 201 and 203 flow in opposite directions. Furthermore, due to this arrangement, coupling currents induced into, e.g., L4, flow in the opposite direction of coupling currents induced into L2 and L6. As a result, currents induced into an inductor of one filter as a result of excitation currents in an adjacent filter are substantially (if not completely) canceled. This occurs in both directions as well, thereby reducing the coupling currents between the inductors of the adjacent filters. If L4 were instead arranged in an opposite orientation than shown here, these coupling currents would be enhanced, thereby reducing performance of all filters in this embodiment. Instead, due to the cancellation of the coupling currents, filter performance may be significantly improved, and thereby lead to improved performance of the systems in which they are implemented.

It is noted that the inductors shown in FIG. 2 have diagonal corners. However, the illustrated shape is not intended to be limiting. On the contrary, a variety of different inductor shapes are possible and contemplated, including those with square/rectangular corners.

Alternating Filter Arrangement for Coupling Current Cancellation

Figure 3:
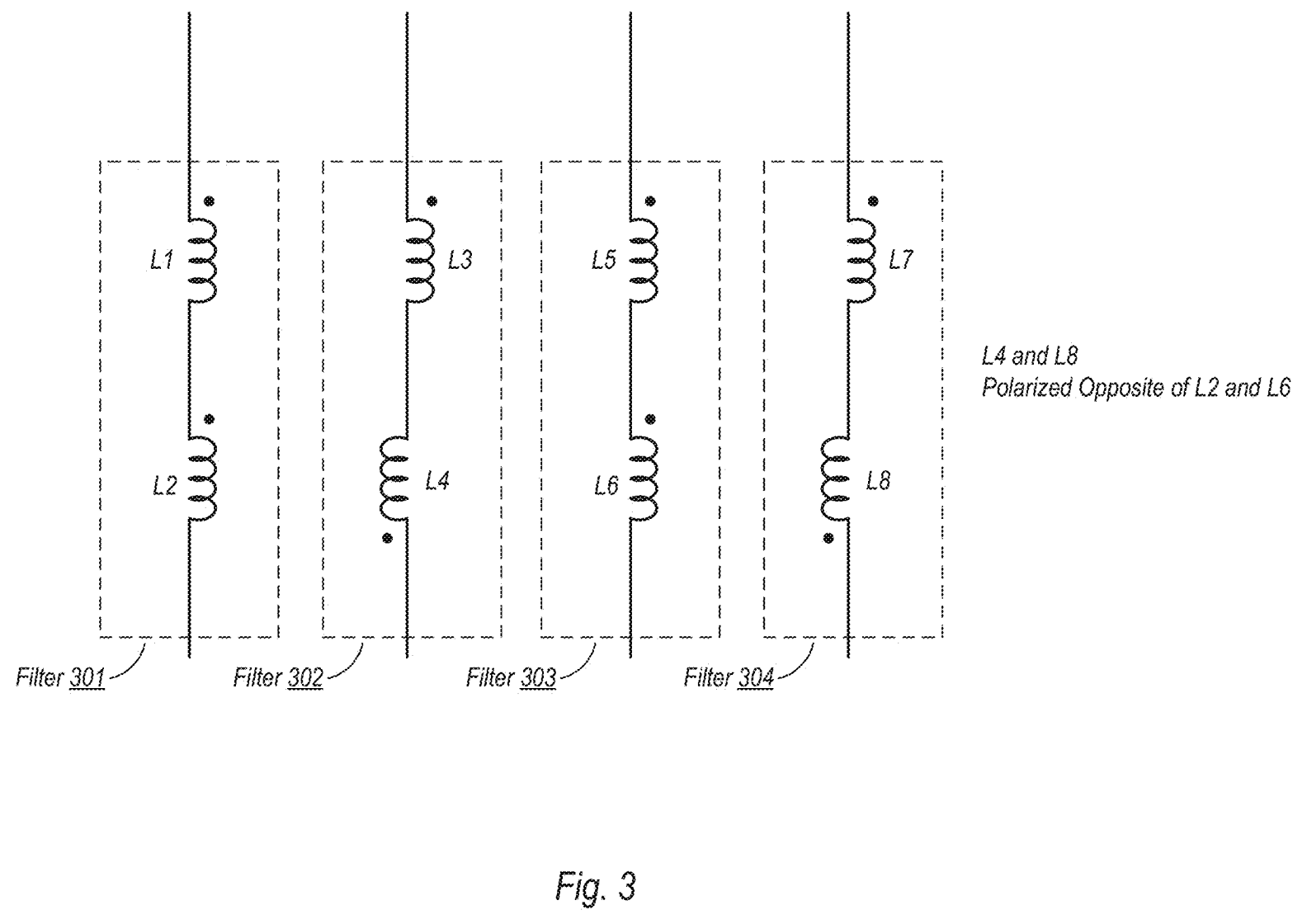

FIG. 3 is a schematic diagram illustrating an alternating arrangement of a plurality of filters configured for coupling current cancellation. In the example shown, the inductor portions of four different filters 301, 302, 303, and 304 are shown. As noted above, each of the filters may include other components not shown here, and this may include combinations of passive and active components, as desired.

Filters 301-304 may be implemented in such a manner that they are physically adjacent to one another. Filter 301 includes inductors L1 and L2, filter 302 inductors L3 and L4, filter 303 inductors L5 and L6, and filter 304 inductors L7 and L8. Inductor L3 is physically adjacent to inductors L1 and L5, the latter of which is also physically adjacent to inductor L7. Similarly, inductor L4 is physically adjacent to inductors L2 and L6, while the latter is also adjacent to inductor L8.

Inductors L1, L3, L5 and L7 are all polarized in the same direction. For example, if the inductors are implemented in a manner similar to those of FIG. 3, inductors L1, L3, L5 and L7 could all be arranged in the same direction, e.g., counter-clockwise. In contrast, the polarities of inductors L2, L4, L6, and L8 vary in an alternating arrangement, with inductors L4 and L8 having polarities opposite of inductors L2 and L6. This arrangement may be extended further to include additional filters in any desired number. With inductors L4 and L8 polarized in a direction opposite that of inductors L2 and L6, coupling currents may be canceled in each of filters 301-304 as described above.

Example Filter Types with Coupling Current Cancellation Arrangement

Various embodiments of the arrangement discussed above may be utilized in a wide variety of filters, with varying inductor arrangements. FIGS. 4A-4E illustrate some of these arrangements.

Figure 4B:
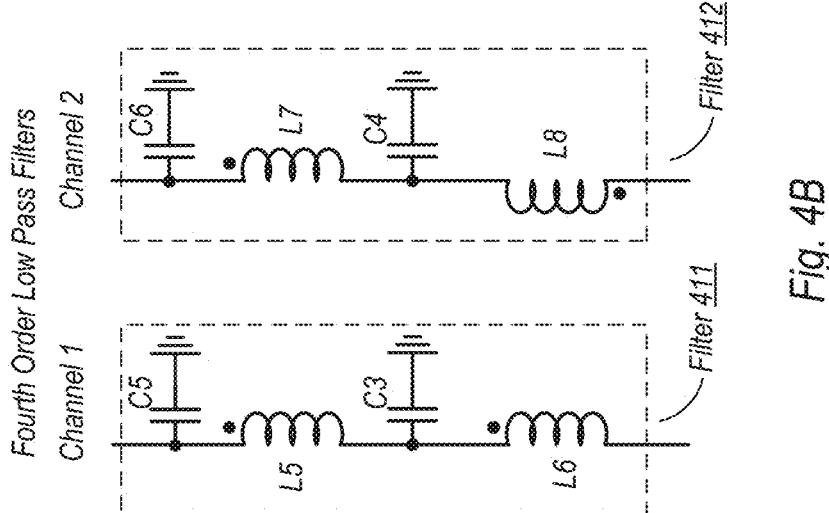
FIGS. 4A-4E are schematic diagrams of different types of filters that may be implemented in accordance with the disclosure.
Figure 4A:
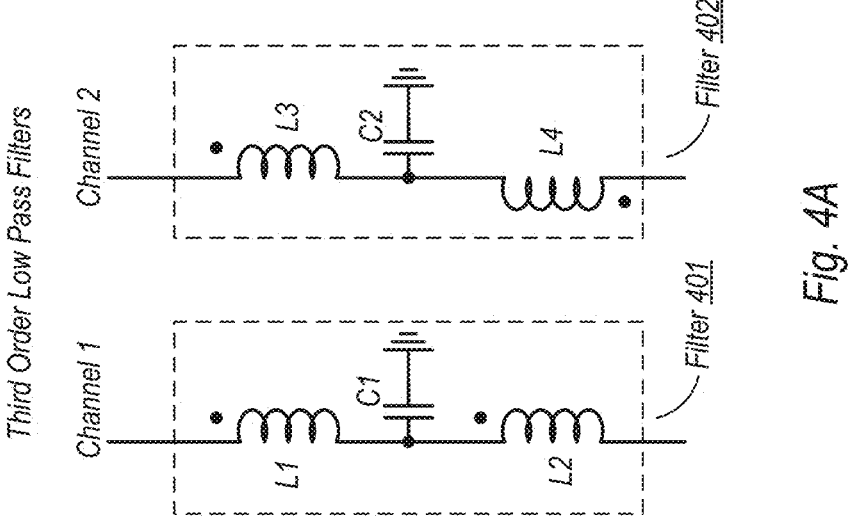

FIG. 4A is a schematic diagram of a pair of low-pass filters that may be physically arranged for the cancellation of coupling currents per the various techniques discussed in this disclosure. In the embodiment shown, filter 401 is dedicated for use by a first channel (Channel 1) while filter 402 is dedicated for use by a second channel (Channel 2). Both of low-pass filters 401 and 402 are third order filters. Filter 401 includes capacitor C1 while filter 402 includes capacitor C2.

Filters 401 and 402 and the inductors thereof are arranged in accordance with the polarization technique of this disclosure. Thus, while L1 and L3 are polarized in the same direction, inductors L2 and L4 are polarized in opposite directions with respect to one another. These inductors may be physically adjacent to one another in the implementation of filters 401 and 402. Accordingly, coupling currents induced into the inductors of the filters are substantially or completely canceled FIG. 4B is a schematic diagram of two fourth-order low-pass filters. Filters 411 and 412 in the embodiment shown are fourth-order filters each including two inductors and two capacitors. Filter 411 includes inductors L5 and L6 along with capacitors C3 and, C5. Filter 412 includes inductors L7 and L8, along with capacitors C4 and C6. In their physical implementation, filters 411 and 412 may be placed adjacent to one another, with inductors L6 and L8 being in close proximity. These two inductors are polarized in opposite directions, and may thus realize the substantial or complete elimination of coupling currents in a manner similar to the other embodiments of this disclosure.

Figures 4C, 4D, 4E:
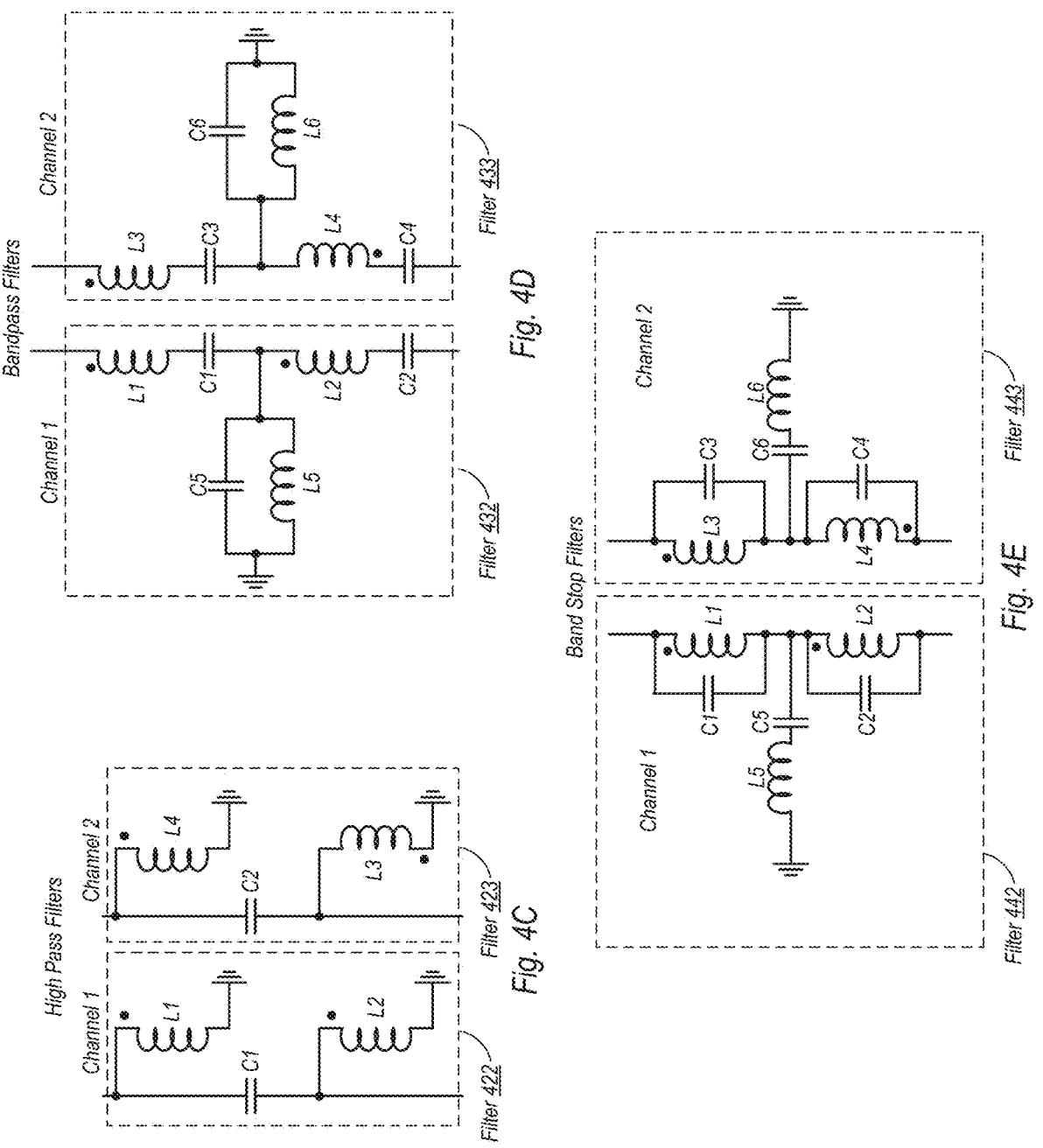

FIG. 4C is a schematic diagram of two high-pass filters, filters 422 and 423. Filter 422 includes inductors L1 and L2, along with capacitor C1, which provides AC coupling between the two. Similarly, filter 423 includes inductors L3 and L4, along with capacitor C2, and is configured for operation similar to that of filter 422 (although the cutoff points may be different). The physical arrangement of filters 422 and 423 is such that inductors L1 and L4 are adjacent to one another, as are inductors L2 and L3. However, the respective polarizations of inductors L2 and L3 are opposite one another in order to achieve the cancellation of coupling currents in accordance with the present disclosure.

FIG. 4D is a schematic diagram of two bandpass filters that may be physically adjacent to one another in their implementation. Filters 432 and 433 may operate in a similar manner, although the respective frequency bands that pass through each may be different from one another. Filter 432 includes inductors L1, L2, and L5, along with capacitors C1, C2, and C5. Filter 433 includes inductors L3, L4, and L6, along capacitors C3, C4, and C6. Filters 432 and 433 are arranged such that inductors L1 and L3 are physically adjacent to one another, as are inductors L2 and L4. L1 and L3 are polarized in the same direction, while inductors L2 and L4 are polarized in opposite direction. Due to the opposite polarizations of L2 and L4, coupling currents induced in both filters may be cancelled, leading to better filter performance.

FIG. 4E is a schematic diagram of a pair of band stop filters that may be arranged physically adjacent to one another. In the embodiment shown, filter 442 includes inductors L1, L2, and L5, along with capacitors C1, C2, and C5. Filter 443 includes inductors L3, L4, and L6, along with capacitors C3, C4, and C6. Filters 442 and 443 are arranged such that inductors L1 and L3 are physically adjacent to one another, as are inductors L2 and L4. Inductors L1 and L3 are polarized in the same direction, while inductors L2 and L4 are polarized in opposite directions. Accordingly, coupling current passing through both filters are cancelled due to the opposite polarizations of L2 and L4.

Receiver Embodiments

Figure 5B:
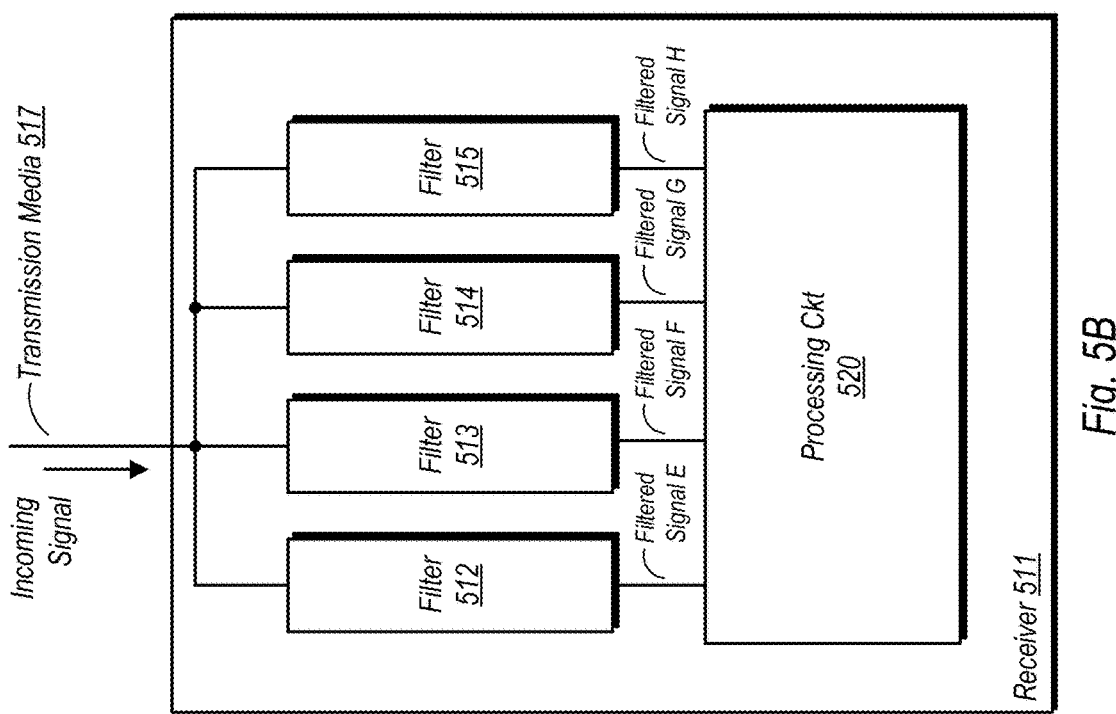
FIGS. 5A-5B are block diagrams of example receivers in which the filter arrangement of the present disclosure may be implemented.
Figure 5A:
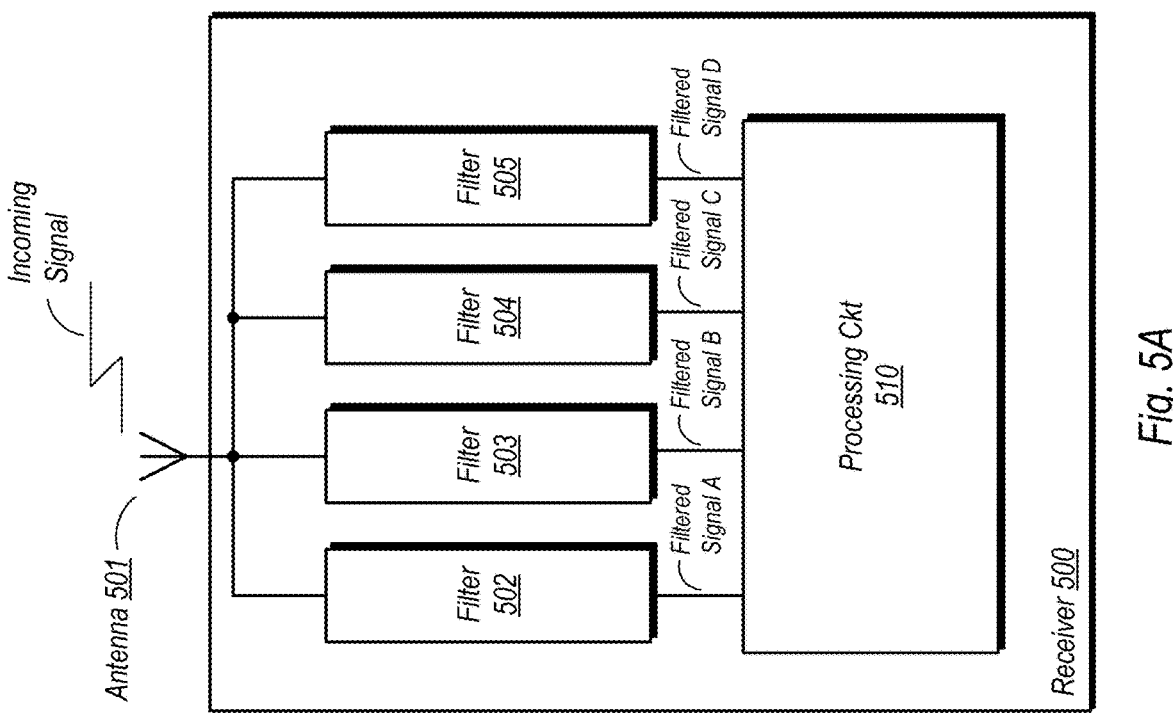

FIGS. 5A and 5B are block diagrams of multi-channel communications system in which the filter arrangements discussed above may be utilized. FIG. 5A is directed to a wireless receiver having multiple channels, with filters 502, 503, 504, and 505 coupled to antenna 501 and are configured to output filtered signals A, B, C, and D, respectively, to processing circuit 510. Processing circuit 510 may provide various processing functions for the received, filtered signals, such as frequency down conversion (e.g., to a baseband frequency), conversion of analog signals into a digital format, decoding, and so on.

Receiver 500 may be one of a number of different types of wireless receivers. In one example embodiment, receiver 500 may be a receiver that in a communication system that utilizes frequency-hopping spread spectrum, and each of filters 502 may be a bandpass filter configured to allow frequencies of a particular band to pass. Other types of wireless communications systems are possible and contemplated.

Each of filters 502-505 in the embodiment shown may include inductors, as well as other passive components, and may be physically arranged near one another. Furthermore, the filters may be arranged such that some inductors of adjacent filters are polarized in the opposite direction with respect to one another, similar to the filter arrangements discussed above with respect to FIGS. 1-4E.

Receiver 511 of FIG. 5B is part of a wired communications system, and is configured to receive signals via transmission medium 517, which may be, e.g., a co-axial cable or some other type of transmission medium. Filters 512-515 in the embodiment shown are configured to filter signals received over transmission medium 517 and output filters signals E-H, respectively. Processing circuit 520 may receive the filtered signals and perform additional processing functions, such as conversion to digital and decoding. In one example embodiment, receiver 511 may be part of an analog communication system that utilizes frequency division multiplexing, although other types are possible and contemplated.

As with the embodiment of FIG. 5A, the filters 512-515 may be physically arranged in proximity to one another, and each may include inductors along with other passive components. The inductors may be arranged such that in alternating filters, at least one inductor is polarized with respect to adjacent inductors in the other filters such that coupling currents are cancelled, in accordance with the other arrangements discussed above with respect to FIGS. 1-4E.

Method for Operating

FIG. 6 is a flow diagram of one embodiment of a method for operating a plurality of filters according to the disclosure. Method 600 may be carried out using any of the filter arrangements discussed above, using various types of filters. Filter arrangements not explicitly disclosed herein but otherwise capable of carrying out Method 600 are also considered to fall within the scope of this disclosure.

Method 600 begins with filtering a first signal in a first channel using a first filter, the first filter having a first plurality of inductors (block 605) and filtering a second signal in a second channel using a second filter, the second plurality of inductors, wherein the first and second filters are physically adjacent to one another (block 610). Method 600 further includes canceling magnetic coupling currents induced into the first and second filters, wherein first and second ones of the first plurality of inductors and a first one of the second plurality of inductors are polarized in a first direction, and wherein a second one of the second plurality of inductors polarized in a second direction opposite that of the first direction, and wherein the canceling comprises an induced current flowing in the second one of the second plurality of inductors flowing an opposite direction of induced current in the first one of the second plurality of inductors (block 615).

In various embodiments, the method includes filtering a third signal in a third channel using a third filter having a third plurality of inductors, wherein the second filter is adjacent to the third filter and arranged between the first and third filters. Such embodiments may also include filtering a fourth signal in a fourth channel using a fourth filter having a fourth plurality of inductors, wherein third filter is adjacent to the fourth filter and arranged between the second and fourth filters, wherein first and second ones of the third plurality of inductors and a first one of the fourth plurality of inductors are polarized in the first direction, and wherein a second one of the fourth plurality of inductors is polarized in the second direction. In these various embodiments, the method includes canceling magnetic coupling currents induced into the third and fourth filters.

Some embodiments are also possible and contemplated that include low pass filtering signals in the first and second channels using the first and second filters, respectively. Other embodiments may include high pass filtering signals in the first and second channels using the first and second filters, respectively. Yet other embodiments may include band pass filtering signals in the first and second channels using the first and second filters, respectively.

Example Device

Figure 7:
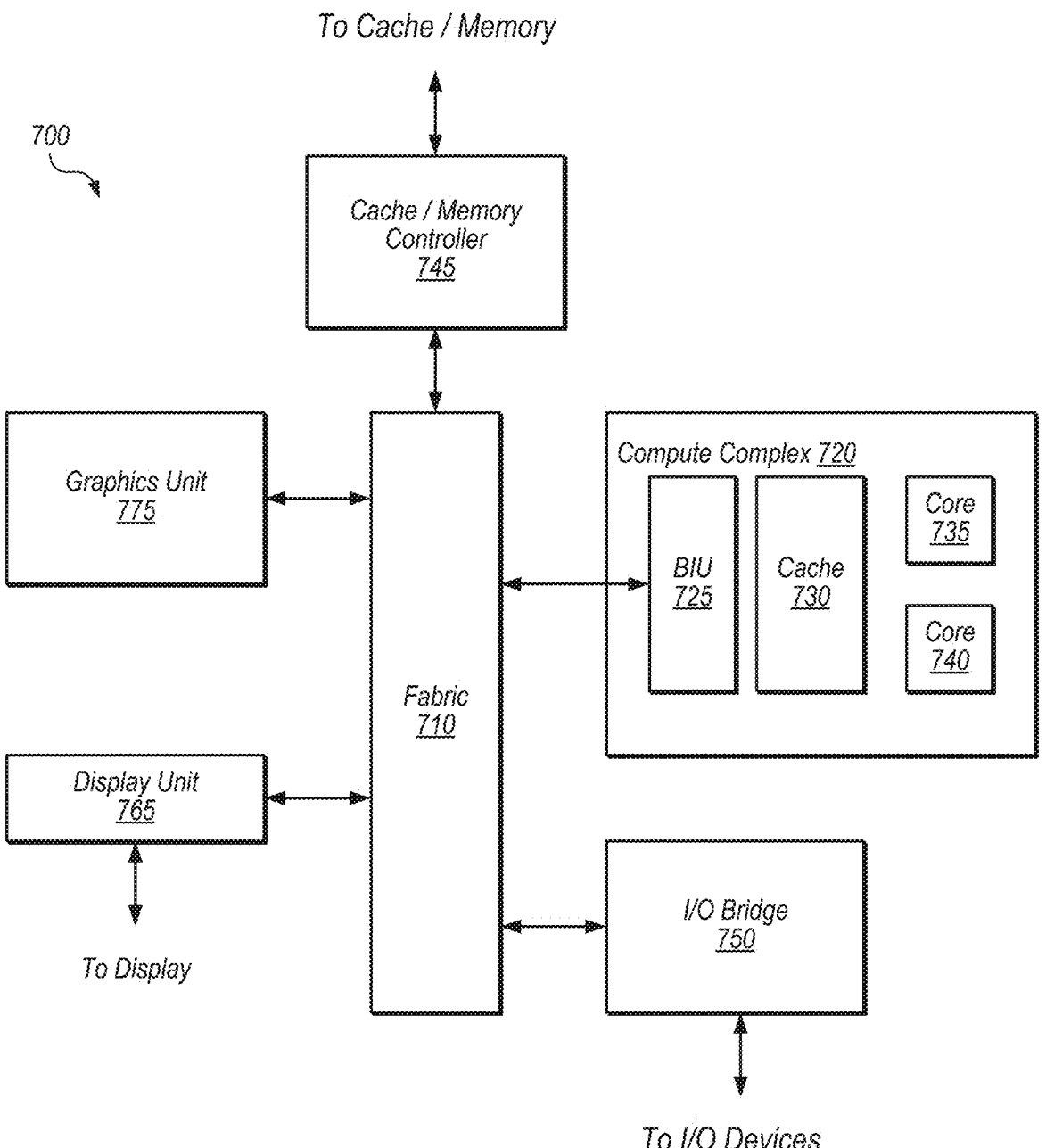
FIG. 7 is a block diagram of one embodiment of a device that may utilize the filter arrangement of the present disclosure.

Referring now to FIG. 7, a block diagram illustrating an example embodiment of a device 700 is shown. In some embodiments, elements of device 700 may be included within a system on a chip. In some embodiments, device 700 may be included in a mobile device, which may be battery-powered. Therefore, power consumption by device 700 may be an important design consideration. In the illustrated embodiment, device 700 includes fabric 710, compute complex 720 input/output (I/O) bridge 750, cache/memory controller 745, graphics unit 775, and display unit 765. In some embodiments, device 700 may include other components (not shown) in addition to or in place of the illustrated components, such as video processor encoders and decoders, image processing or recognition elements, computer vision elements, etc.

Fabric 710 may include various interconnects, buses, MUX's, controllers, etc., and may be configured to facilitate communication between various elements of device 700. In some embodiments, portions of fabric 710 may be configured to implement various different communication protocols. In other embodiments, fabric 710 may implement a single communication protocol and elements coupled to fabric 710 may convert from the single communication protocol to other communication protocols internally.

In the illustrated embodiment, compute complex 720 includes bus interface unit (BIU) 725, cache 730, and cores 735 and 740. In various embodiments, compute complex 720 may include various numbers of processors, processor cores and caches. For example, compute complex 720 may include 1, 2, or 4 processor cores, or any other suitable number. In one embodiment, cache 730 is a set associative L2 cache. In some embodiments, cores 735 and 740 may include internal instruction and data caches. In some embodiments, a coherency unit (not shown) in fabric 710, cache 730, or elsewhere in device 700 may be configured to maintain coherency between various caches of device 700. BIU 725 may be configured to manage communication between compute complex 720 and other elements of device 700. Processor cores such as cores 735 and 740 may be configured to execute instructions of a particular instruction set architecture (ISA) which may include operating system instructions and user application instructions. These instructions may be stored in computer readable medium such as a memory coupled to memory controller 745 discussed below.

As used herein, the term "coupled to" may indicate one or more connections between elements, and a coupling may include intervening elements. For example, in FIG. 7, graphics unit 775 may be described as "coupled to" a memory through fabric 710 and cache/memory controller 745. In contrast, in the illustrated embodiment of FIG. 7, graphics unit 775 is "directly coupled" to fabric 710 because there are no intervening elements.

Cache/memory controller 745 may be configured to manage transfer of data between fabric 710 and one or more caches and memories. For example, cache/memory controller 745 may be coupled to an L3 cache, which may in turn be coupled to a system memory. In other embodiments, cache/memory controller 745 may be directly coupled to a memory. In some embodiments, cache/memory controller 745 may include one or more internal caches. Memory coupled to controller 745 may be any type of volatile memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to controller 745 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 720 to cause the computing device to perform functionality described herein.

Graphics unit 775 may include one or more processors, e.g., one or more graphics processing units (GPUs). Graphics unit 775 may receive graphics-oriented instructions, such as OPENGL®, Metal®, or DIRECT3D® instructions, for example. Graphics unit 775 may execute specialized GPU instructions or perform other operations based on the received graphics-oriented instructions. Graphics unit 775 may generally be configured to process large blocks of data in parallel and may build images in a frame buffer for output to a display, which may be included in the device or may be a separate device. Graphics unit 775 may include transform, lighting, triangle, and rendering engines in one or more graphics processing pipelines. Graphics unit 775 may output pixel information for display images. Graphics unit 775, in various embodiments, may include programmable shader circuitry which may include highly parallel execution cores configured to execute graphics programs, which may include pixel tasks, vertex tasks, and compute tasks (which may or may not be graphics-related).

Display unit 765 may be configured to read data from a frame buffer and provide a stream of pixel values for display. Display unit 765 may be configured as a display pipeline in some embodiments. Additionally, display unit 765 may be configured to blend multiple frames to produce an output frame. Further, display unit 765 may include one or more interfaces (e.g., MIPI® or embedded display port (eDP)) for coupling to a user display (e.g., a touchscreen or an external display).

I/O bridge 750 may include various elements configured to implement: universal serial bus (USB) communications, security, audio, and low-power always-on functionality, for example. I/O bridge 750 may also include interfaces such as pulse-width modulation (PWM), general-purpose input/output (GPIO), serial peripheral interface (SPI), and inter-integrated circuit (I2C), for example. Various types of peripherals and devices may be coupled to device 700 via I/O bridge 750.

In some embodiments, device 700 includes network interface circuitry (not explicitly shown), which may be connected to fabric 710 or I/O bridge 750. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 700 with connectivity to various types of other devices and networks.

The various communications circuitry discussed in the previous paragraph may implement one or more instances of the filter arrangement of the present disclosure. The filters may be implemented using passive components, including inductors, and with the filters physically adjacent to one another. Alternating ones of the filters may have an inductor that is polarized in an opposite direction from another adjacent inductor in an adjacent filter, for the purposes of canceling coupling currents that are otherwise induced. This allows for better filter performance and overall better performance of the communications links that use these filters.

Example Applications

Figure 8:
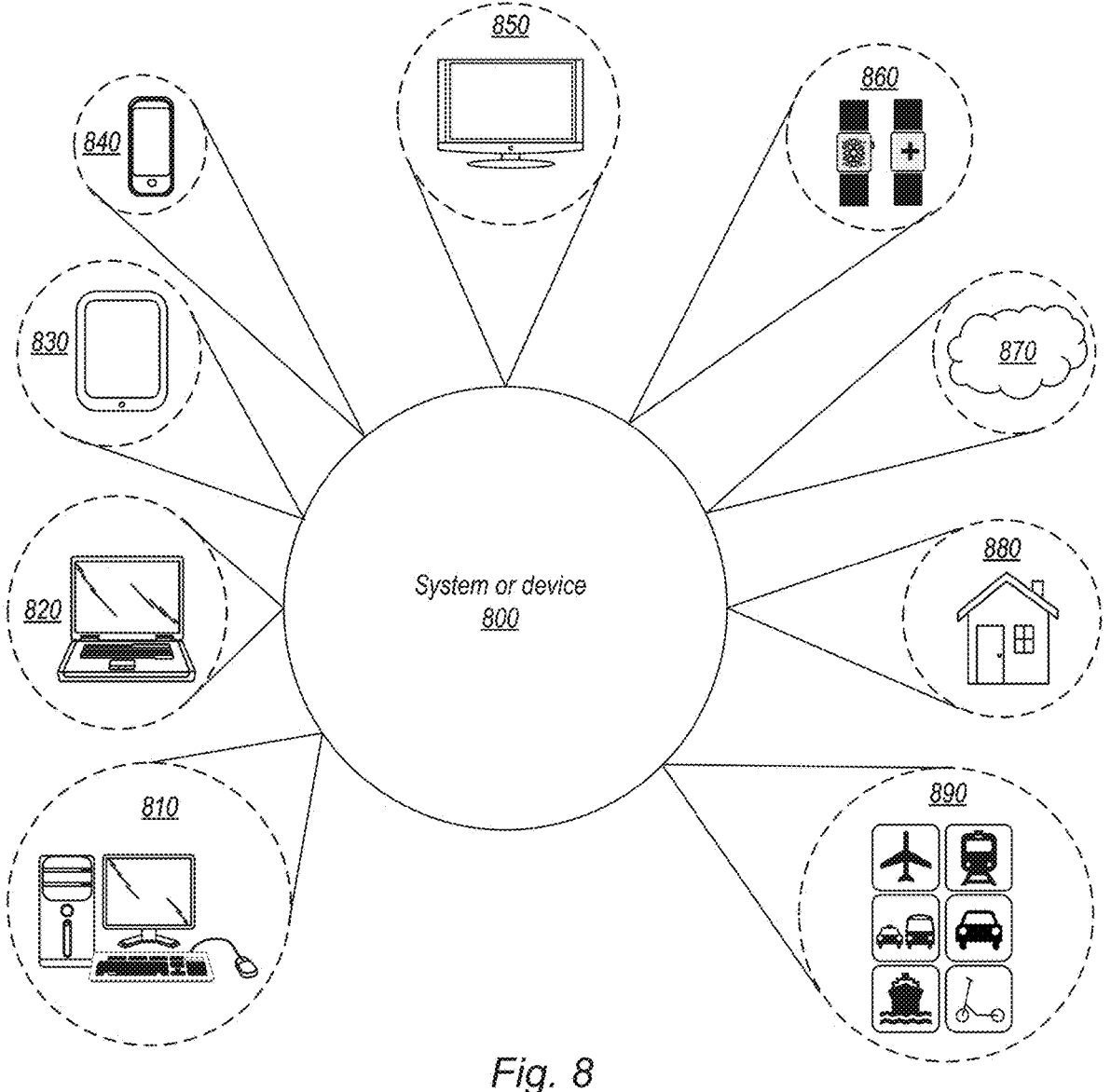
FIG. 8 is a diagram illustrating different systems that may utilize the filter arrangement of the disclosure.

Turning now to FIG. 8, various types of systems that may include any of the circuits, devices, or system discussed above. System or device 800, which may incorporate or otherwise utilize one or more of the techniques described herein, may be utilized in a wide range of areas. For example, system or device 800 may be utilized as part of the hardware of systems such as a desktop computer 810, laptop computer 820, tablet computer 830, cellular or mobile phone 840, or television 850 (or set-top box coupled to a television).

Similarly, disclosed elements may be utilized in a wearable device 860, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 800 may also be used in various other contexts. For example, system or device 800 may be utilized in the context of a server computer system, such as a dedicated server or on shared hardware that implements a cloud-based service 870. Still further, system or device 800 may be implemented in a wide range of specialized everyday devices, including devices 880 commonly found in the home such as refrigerators, thermostats, security cameras, etc. The interconnection of such devices is often referred to as the "Internet of Things" (IoT). Elements may also be implemented in various modes of transportation. For example, system or device 800 could be employed in the control systems, guidance systems, entertainment systems, etc. of various types of vehicles 890.

In various embodiments, a system or device 800 as shown here may implement circuitry that includes instances of the filters of the present disclosure. Multiple filters may be implemented in an arrangement where they are physically adjacent to one another, and may utilize passive components including inductors, with at least some inductors polarized in an opposite direction with respect to their counterparts in an adjacent filter for the purpose of canceling coupling currents.

The applications illustrated in FIG. 8 are merely exemplary and are not intended to limit the potential future applications of disclosed systems or devices. Other example applications include, without limitation: portable gaming devices, music players, data storage devices, unmanned aerial vehicles, etc.

Example Computer Readable Medium

The present disclosure has described various example circuits in detail above. It is intended that the present disclosure cover not only embodiments that include such circuitry, but also a computer-readable storage medium that includes design information that specifies such circuitry. This includes various embodiments of the circuitry discussed above, and in particular, the filters implemented using passive components and with instances thereof arranged physically adjacent to one another. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as: design simulation, design synthesis, circuit fabrication, etc.

Figure 9:
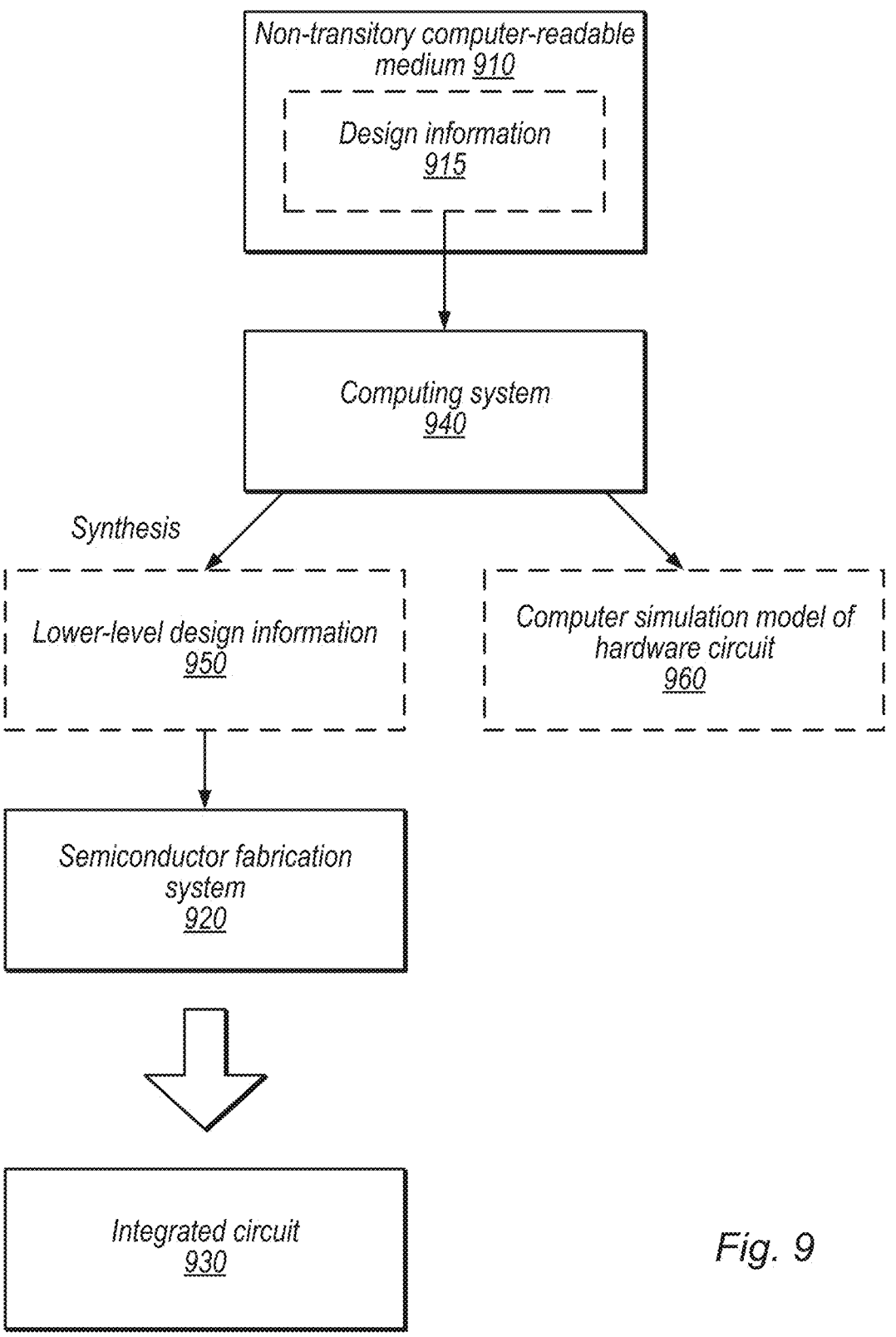
FIG. 9 is a diagram of one embodiment of a non-transitory computer readable medium that stores circuit design information including circuits in accordance with the disclosure.

FIG. 9 is a block diagram illustrating an example non-transitory computer-readable storage medium that stores circuit design information, according to some embodiments. In the illustrated embodiment, computing system 940 is configured to process the design information. This may include executing instructions included in the design information, interpreting instructions included in the design information, compiling, transforming, or otherwise updating the design information, etc. Therefore, the design information controls computing system 940 (e.g., by programming computing system 940) to perform various operations discussed below, in some embodiments.

In the illustrated example, computing system 940 processes the design information to generate both a computer simulation model of a hardware circuit 960 and lower-level design information 950. In other embodiments, computing system 940 may generate only one of these outputs, may generate other outputs based on the design information, or both. Regarding the computing simulation, computing system 940 may execute instructions of a hardware description language that includes register transfer level (RTL) code, behavioral code, structural code, or some combination thereof. The simulation model may perform the functionality specified by the design information, facilitate verification of the functional correctness of the hardware design, generate power consumption estimates, generate timing estimates, etc.

In the illustrated example, computing system 940 also processes the design information to generate lower-level design information 950 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on lower-level design information 950 (potentially among other inputs), semiconductor fabrication system 920 is configured to fabricate an integrated circuit 930 (which may correspond to functionality of the simulation model 960). Note that computing system 940 may generate different simulation models based on design information at various levels of description, including information 950, 915, and so on. The data representing design information 950 and model 960 may be stored on medium 910 or on one or more other media.

In some embodiments, the lower-level design information 950 controls (e.g., programs) the semiconductor fabrication system 920 to fabricate the integrated circuit 930. Thus, when processed by the fabrication system, the design information may program the fabrication system to fabricate a circuit that includes various circuitry disclosed herein.

Non-transitory computer-readable storage medium 910, may comprise any of various appropriate types of memory devices or storage devices. Non-transitory computer-readable storage medium 910 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 910 may include other types of non-transitory memory as well or combinations thereof. Accordingly, non-transitory computer-readable storage medium 910 may include two or more memory media; such media may reside in different locations—for example, in different computer systems that are connected over a network.

Design information 915 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 940, semiconductor fabrication system 920, or both. In some embodiments, design information may also include one or more cell libraries that specify the synthesis, layout, or both of integrated circuit 930. In some embodiments, the design information is specified in whole or in part in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 930 may, in various embodiments, include one or more custom macrocells, such as memories, analog or mixed-signal circuits, and the like. In such cases, design information may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 and model 960 are configured to operate according to a circuit design specified by design information 915, which may include performing any of the functionality described herein. For example, integrated circuit 930 may include any of various elements shown in FIGS. 1-5B. Further, integrated circuit 930 may be configured to perform various functions described herein in conjunction with other components.

Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model" does not imply that the instructions must be executed in order for the element to be met, but rather specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by the design information. The different circuit implementations may affect the performance, area, power consumption, etc. of a given design (potentially with tradeoffs between different design goals), but the logical function does not vary among the different circuit implementations of the same circuit design.

In some embodiments, the instructions included in the design information instructions provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information. The lower-level design information may program fabrication system 920 to fabricate integrated circuit 930.

It is noted that while the circuits discussed above have been implemented using NMOS and PMOS transistors, the disclosure is not intended to limit embodiments falling within its scope to these types of devices. Thus, in addition to various MOSFET types discussed above, the present disclosure also contemplates embodiments that use non-planar devices such as FinFETs, GAAFETs (Gate All Around FETs), among other types. Embodiments implemented using Bipolar devices are also possible and contemplated. The disclosure further contemplates that technologies that are speculative as of this writing may be used to implement devices in various embodiments of the circuits discussed herein. These technologies include (but are not limited to) graphene transistors, carbon nanotube transistors, gallium arsenide transistors, and so on. The use of memristors in certain circuit structures is also contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims.

Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended <u>not</u> to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:
1. An apparatus comprising:
a first filter including a first plurality of inductors; and
a second filter including a second plurality of inductors,
wherein the first and second filters are implemented physically adjacent to one another;
wherein:
first and second ones of the first plurality of inductors and a first one of the second plurality of inductors are polarized in a first direction;
a second one of the second plurality of inductors is polarized in a second direction opposite that of the first direction;
the first and second ones of the first plurality of inductors are coupled in series;
the first and second ones of the second plurality of inductors are coupled in series; and
the second one of the second plurality of inductors is physically adjacent to one of the first and second ones of the first plurality of inductors such that magnetic coupling currents induced into one another are canceled.
2. The apparatus of claim 1, further comprising:
a third filter including a third plurality of inductors, wherein the second filter is arranged between and physically adjacent to both of the first and third filters, and wherein ones of the third plurality of inductors are polarized in the first direction, wherein first and second ones of the third plurality of inductors are coupled in series.

3. The apparatus of claim 2, further comprising:

a fourth filter, wherein the third filter is arranged between and physically adjacent to the second and fourth filters, wherein the fourth filter includes a fourth plurality of inductors including one inductor polarized in the first direction and another inductor polarized in the second direction, wherein first and second ones of the fourth plurality of inductors are coupled in series.

4. The apparatus of claim 1, wherein the first and second filters are implemented on an integrated circuit die.

5. The apparatus of claim 1, wherein the first and second filters are implemented on a printed circuit board.

6. The apparatus of claim 1, wherein the first filter includes at least one capacitor coupled to at least one of first plurality of inductors and wherein the second filter includes at least one capacitor coupled to at least one of second plurality of inductors.

7. The apparatus of claim 1, wherein the first and second filters are low pass filters.

8. The apparatus of claim 1, wherein the first and second filters are high pass filters.

9. The apparatus of claim 1, wherein the first and second filters are bandpass filters.

10. The apparatus of claim 1, wherein the first and second filters are band stop filters.

11. A method comprising:

filtering a first signal in a first channel using a first filter, the first filter having a first plurality of inductors;

filtering a second signal in a second channel using a second filter having a second plurality of inductors, wherein the first and second filters are physically adjacent to one another; and canceling magnetic coupling currents induced into the first and second filters, wherein:

first and second ones of the first plurality of inductors and a first one of the second plurality of inductors are polarized in a first direction;

a second one of the second plurality of inductors polarized in a second direction opposite that of the first direction;

the first and second ones of the first plurality of inductors are coupled in series;

the first and second ones of the second plurality of inductors are coupled in series; and the canceling comprises an induced current flowing in the second one of the second plurality of inductors flowing an opposite direction of induced current in the first one of the second plurality of inductors.

12. The method of claim 11, further comprising:

filtering a third signal in a third channel using a third filter having a third plurality of inductors, wherein the second filter is adjacent to the third filter and arranged between the first and third filters;

filtering a fourth signal in a fourth channel using a fourth filter having a fourth plurality of inductors, wherein the third filter is adjacent to the fourth filter and arranged between the second and fourth filters, wherein:

first and second ones of the third plurality of inductors and a first one of the fourth plurality of inductors are polarized in the first direction;

a second one of the fourth plurality of inductors is polarized in the second direction;

the first and second ones of the third plurality of inductors are coupled in series;

the first and second ones of the fourth plurality of inductors are coupled in series; and canceling magnetic coupling currents induced into the third and fourth filters.

13. The method of claim 11, further comprising:

using the first and second filters to low pass filter signals in the first and second channels, respectively.

14. The method of claim 11, further comprising:

using the first and second filters to high pass filter signals in the first and second channels, respectively.

15. The method of claim 11, further comprising:

using the first and second filters to band pass filter signals in the first and second channels, respectively.

16. A system comprising:

a receiver circuit, wherein the receiver circuit includes a plurality of filter circuits corresponding to ones of a plurality of channels, wherein the plurality of filter circuits include:

a first passive filter circuit having a first plurality of inductors including first and second inductors coupled in series; and a second passive filter circuit having a second plurality of inductors including third and fourth inductors coupled in series, wherein the first passive filter circuit is physically adjacent to the first passive filter circuit; and wherein the first, second, and third inductors are polarized in a first direction and wherein the fourth inductor is polarized in a second direction opposite of the first direction and is configured to cancel magnetic coupling current induced into the first and second pluralities of inductors.

17. The system of claim 16, further comprising:

a third passive filter circuit including a third plurality of inductors including first and second ones of the third plurality of inductors coupled in series, wherein the third passive filter circuit is physically adjacent to the second passive filter circuit, and wherein the second passive filter circuit is arranged between the first and third passive filter circuits; and a fourth passive filter circuit including a fourth plurality of inductors including first and second ones of the fourth plurality of inductors coupled in series, wherein the fourth passive filter circuit is physically adjacent to the third passive filter circuit, and wherein the third passive filter circuit is arranged between the second and fourth passive filter circuits; and wherein ones of the third plurality of inductors are polarized in the first direction, and wherein at least one of the fourth plurality of inductors includes an inductor polarized in the second direction.

18. The system of claim 16, wherein the first and second passive filter circuits are low pass filter circuits.

19. The system of claim 16, wherein the first and second passive filter circuits are high pass filter circuits.

20. The system of claim 16, wherein the first and second passive filter circuits are band pass filter circuits.

* * * * *